United States Patent
Jung

[11] Patent Number: 6,114,896
[45] Date of Patent: *Sep. 5, 2000

[54] COMPLEMENTARY MULTIPLEXER WITH LOW DISABLED-OUTPUT CAPACITANCE, AND METHOD

[75] Inventor: Taewon Jung, Malabar, Fla.

[73] Assignee: Intersil Corporation, Palm Bay, Fla.

[*] Notice: This patent is subject to a terminal disclaimer.

[21] Appl. No.: 09/247,510

[22] Filed: Feb. 10, 1999

Related U.S. Application Data

[63] Continuation of application No. 08/777,101, Dec. 30, 1996, Pat. No. 5,923,207.

[51] Int. Cl.[7] ............................................. H03K 17/62
[52] U.S. Cl. ............................................................ 327/407
[58] Field of Search .............................. 327/99, 407, 417, 327/483–489

[56] References Cited

U.S. PATENT DOCUMENTS

| | | | |
|---|---|---|---|
| 4,321,462 | 3/1982 | Numata | 250/211 J |
| 4,813,041 | 3/1989 | Reyneri | 370/112 |
| 5,835,045 | 11/1998 | Ogawa et al. | 327/407 |
| 5,856,754 | 1/1999 | Yamashita | 327/407 |
| 5,864,561 | 1/1999 | Becher | 327/407 |

*Primary Examiner*—My-Trang Nuton
*Attorney, Agent, or Firm*—Rogers & Killeen

[57] ABSTRACT

A complementary multiplexer with low disabled output capacitance and method in which a plurality of switched buffers are packaged together to avoid the capacitance of a plurality of switched buffers applied to the printed-circuit board transmission lines.

2 Claims, 2 Drawing Sheets

COMPLEMENTARY MULTIPLEXER WITH LOW DISABLED-OUTPUT CAPACITANCE, AND METHOD

This is a continuation of application Ser. No. 08/777,101, filed Dec. 30, 1996 now U.S. Pat. No. 5,923,207.

BACKGROUND OF THE INVENTION

The typical N×1 multiplexer chip consists of N analog, switched buffers of which the output nodes are tied together as shown in FIG. 1.

During normal operations, one, at most, of the N channels is conductive and serves as the analog signal path passing either I1, I2 or I3 to the output terminal OUT.

End users of such circuits desiring to implement M×1 multiplexing on a PC board with a plurality of such N×1 multiplexers with M>N generally connect the output terminal of the N×1 multiplexers with a 50 Ω or 75 Ω transmission line, which is capacitively loaded by the disabled non-operating multiplexers.

When the system is on and a single channel selected, the analog signal at the output terminal sees the input impedance of the next stage. In addition, it also sees the impedance of the transmission lines leading to the disabled multiplexers. The output signal travels along each of the transmission lines until it reaches the disabled stages which can be regarded as capacitance, from which it bounces back along the transmission line to the output terminal. The capacitive termination of transmission lines degrades the frequency response of such circuits because the impedance changes with the capacitance. Thus the larger the capacitance, the worse the frequency response and the smaller the bandwidth.

The practice of designing complementary multiplexers by connecting a plurality of individual analog buffers together is an obstacle to higher integration and high system bandwidth.

The individual analog buffer of the circuit of FIG. 1 may be as shown in the circuit of FIG. 2. Referring to FIG. 2, the input signal is applied to the base of complementary transistors Q1 and Q2 each of which is connected between a current source and IA and IB respectively and an appropriate voltage source Vee and Vcc. One of the two transistors conducts in response to the polarity of an input signal IN, and the output signal is taken from the emitter of the enabled transistor and applied to the base of one of the transistors Q3 or Q4, which, when conducting, provides the output signal OUT.

It is accordingly an object of the present invention to obviate many of the problems of known multiplexers and to provide a novel multiplexer and method with dramatically reduced disabled capacitance.

It is another object of the present invention to provide a novel multiplexer and method with dramatically increased bandwidth, i.e., the multiplexing of signals at a higher frequency.

It is still another object of the present invention to provide a novel multiplexer and method in which the number of output channels may be increased without an increase in output capacitance.

These and many other objects and advantages of the present invention will be readily apparent to one skilled in the art to which the invention pertains from a perusal of the claims, the appended drawings, and the following detailed description of the preferred embodiments.

DESCRIPTION OF PREFERRED EMBODIMENTS

Figure 3:
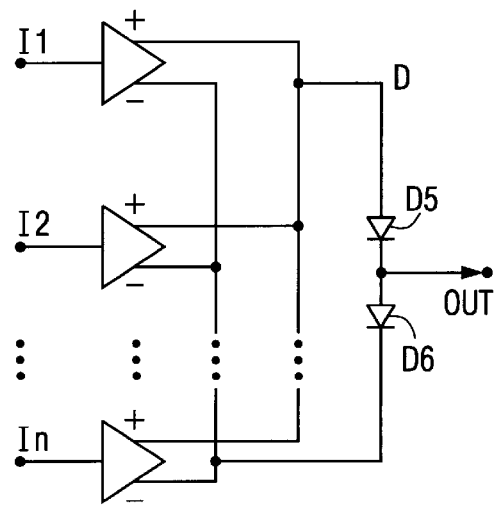
FIG. 3 is a schematic circuit diagram of one embodiment of the complementary multiplexer of the present invention.

The present invention may be understood with reference to FIG. 3 where each of the switchable analog buffers has two output terminals, i.e., a high signal level or "+" terminal and a low signal level or "−" terminal. The + terminals are ganged together as are the − terminals and the output from the enabled buffer is applied through one of the diodes D5 and D6 to the output terminal OUT.

Figure 4:
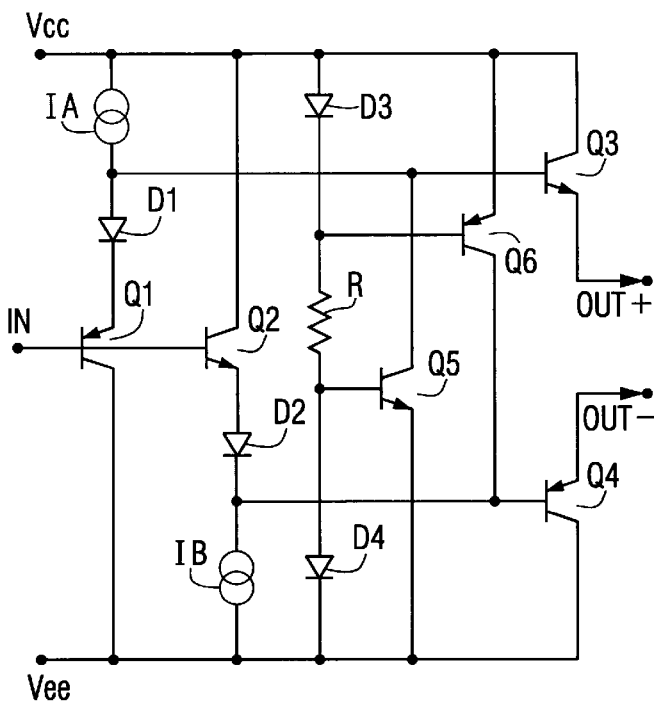
FIG. 4 is a schematic circuit diagram of one embodiment of the switched buffers of the multiplexer of FIG. 3.

The presence of the large signals at the + or − output terminals of the buffers does not interfere with the operation of the other buffers because the internal current sources IA and IB, are turned off in connection with the circuit of FIG. 4. The output terminal sees only the impedance of Q5 or Q6 which largely determine the disabled output capacitance of the multiplexer.

Figure 2:
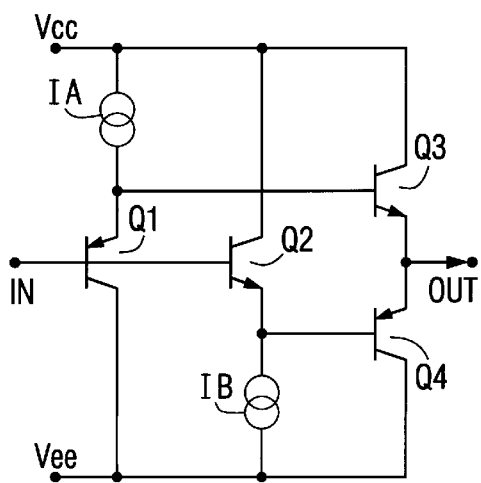
FIG. 2 is a schematic circuit diagram of one of the prior art switched buffers of the multiplexer of FIG. 1.

Each of the switched buffers of FIG. 3 may take the form shown in FIG. 4 where like elements have been given like numerical designations to facilitate comparison with the prior art circuit of FIG. 2.

Referring to FIG. 4, the input signal applied to the input terminal IN is applied to the base of the complementary transistors Q1 and Q2 connected between current sources IA and IB and a suitable voltage source Vee or Vcc as in the prior art circuit of FIG. 2. Note however the addition of a diode D1 or D2 in that circuit.

The output signal taken from the emitter of the transistors Q1 and Q2 of the enabled one is applied to the base of the transistors Q3 and Q4, and the signal taken from the emitter thereof provides the + and − output signals respectively.

With continued reference to FIG. 4, a voltage divider comprising diode D3, resistor R and diode D4 is provided across the voltage Vcc–Vee. The intersection of the diode D3 and the resistor R is connected to the base of the PNP transistors Q6, the emitter of which is connected to Vcc and the collector of which is connected to the base of the output transistor Q4. Similarly, the interconnection of the diode D4 and the resistor R is connected to the base of the NPN transistor Q5, the emitter of which is connected to Vee and the collector of which is connected to the base of the output transistor Q3. In this way, when IA and IB are turned off, the presence of an output signal on the base of one of the output transistors Q3 and Q4 insures through the conduction of one of the transistors Q5 and Q6 that the other one of the output transistors Q3 and Q4 remains nonconducting.

Figure 5:
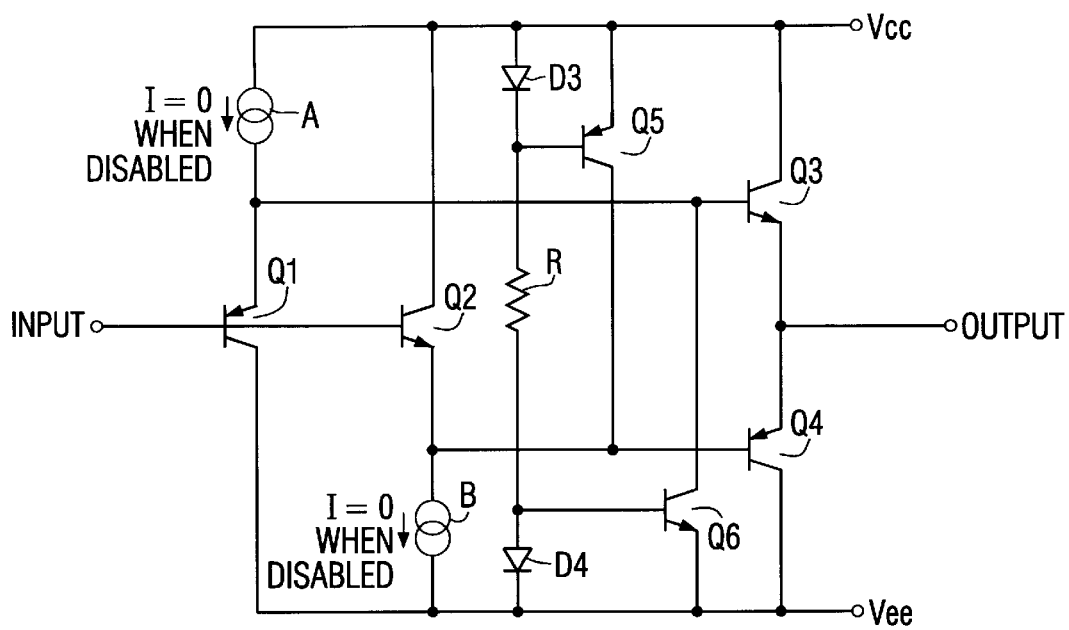
FIG. 5 is a schematic circuit diagram of one embodiment of switched buffers of the complementary multiplexer of FIG. 2 with a disable circuit.

As shown in FIG. 5 where like numerical designation have been used to facilitate a comparison with the circuit of FIG. 4, the complementary buffer may omit the diodes D1 and D2 and connect the emitters of the two output transistors Q3 and Q4 together to provide a disable circuit.

When the current sources IA and IB are turned off, the voltage at the base of the transistor Q3 will be Vee+Vce,sat (Q6). Likewise, the voltage at the base of transistor Q4 will be Vcc+Vce,sat. (Q5). Since the saturation voltages are near zero, the emitter-base junctions of the two output transistors Q3 and Q4 are reverse biased and the single output terminal OUTPUT becomes a high impedance node.

Transistors Q5 and Q6 are always conducting, but this does not interfere with the normal operation of the circuit so long as the resistor R is sufficiently low, e.g., 200 KΩ.

Figure 6:
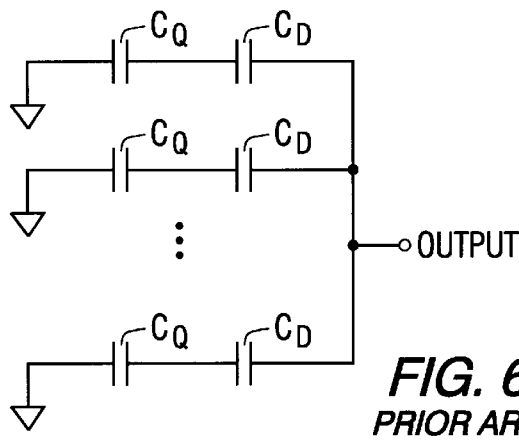
FIG. 6 is a capacitive network representation of a prior 4 X 1 multiplexer chip.
Figure 7:
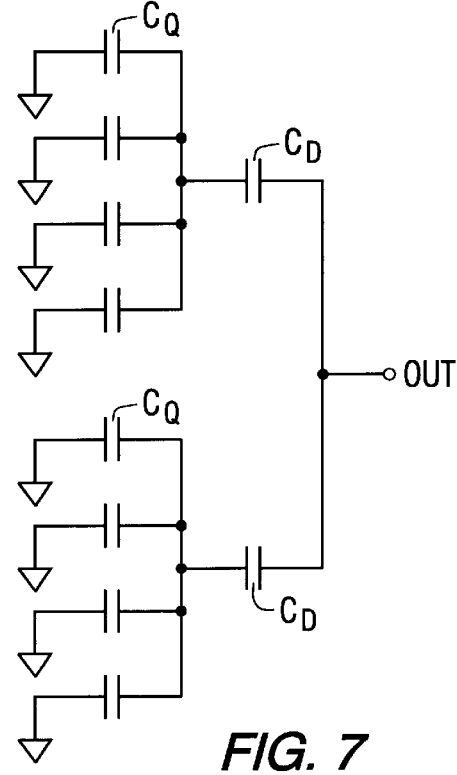
FIG. 7 is a capacitive network representation of the circuit of FIG. 3.

The advantages of the 4×1 multiplexers of the present invention over the 4×1 multiplexers of the prior art may be seen with reference to FIGS. 6 and 7.

Figure 1:
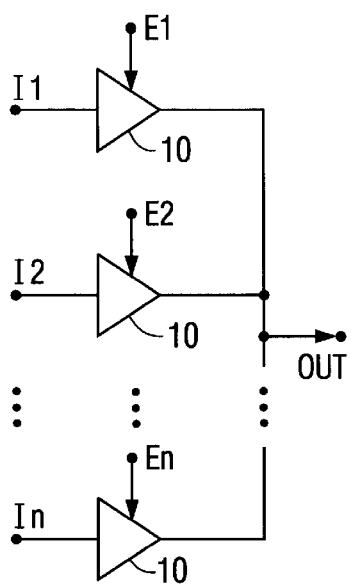
FIG. 1 is a schematic circuit diagram of a prior art complementary multiplexer.

FIG. 6 shows the capacitive network representation of a prior art 4×1 multiplexer chip when disabled, with Cd being the capacitance of a diode and Ct being the capacitance of a transistor in one of the disabled circuits of FIG. 1. Note that the total capacitance of the circuit is:

$$C_{TOTAL} = 8\frac{C_Q C_D}{C_Q + C_D} \qquad (1)$$

FIG. 7 shows the capacitive network representation of the circuit of FIG. 3 where the total capacitance is:

$$C_{TOTAL} = 8\frac{C_Q C_D}{4C_Q + C_D} \qquad (2)$$

From the foregoing, it can be seen that the ratio of the total capacitance of the present invention as shown in FIG. (2) over the prior art Equation (1) is:

$$\frac{1 + C_D/C_Q}{4 + C_D/C_Q} \qquad (3)$$

Figure 8:
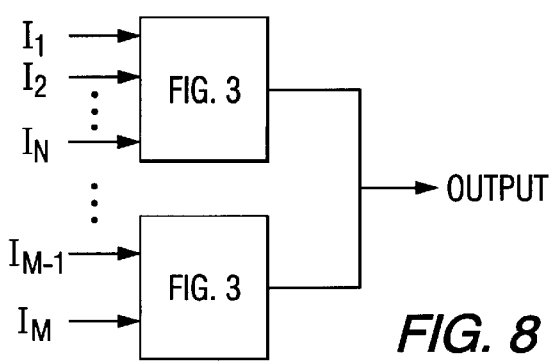
FIG. 8 is a block diagram illustrating an example of an M X 1 multiplexer.

Since $C_Q$ approximates $C_D$ in the usual condition, the ratio of Equation (3) approaches ⅖. Thus it may be seen that the disabled output capacitance of a 4×1 multiplexer may be reduced 60% by using the current invention without the degradation which accompanies the use of transmission lines to accomplish the multiplexing function with a plurality of packaged parts FIG. 8 illustrates an example of an M X 1 multiplexer.

While preferred embodiments of the present invention have been described, it is to be understood that the embodiments described are illustrative only and the scope of the invention is to be defined solely by the appended claims when accorded a full range of equivalence, many variations and modifications naturally occurring to those of skill in the art from a perusal hereof.

What is claimed is:

1. A method of reducing the disabled capacitance of a complementary multiplexer so as to increase the number of channels being multiplexed for a predetermined level of capacitance, the method comprising the steps of:

(a) providing an integrated circuit having:
   a plurality of switched buffers where each of the switched buffers includes one input terminal and complementary high and low output terminals,
   a first unidirectional current device, and
   a second unidirectional current device;

(b) operatively connecting the high output terminals of each of the plurality of switched buffers to the anode of the first unidirectional current device within the integrated circuit;

(c) operatively connecting the low output terminals of each of the plurality of switched buffers to the cathode of the second unidirectional current device within the integrated circuit; and (d) operatively connecting the cathode of the first unidirectional current device to the anode of the second unidirectional current device within the integrated circuit to thereby provide an output terminal for the multiplexer.

2. A method of reducing the disabled capacitance of a complementary M×1 multiplexer so as to increase the number of channels being multiplexed over the number of channels in an N×1 multiplexer where M>N and the dividend of M by N is an integer, without any substantial increase in the level of capacitance in the M×1 multiplexer above the level of capacitance of the N×1 multiplexer, the method comprising the steps of:

(a) providing an integrated circuit having:
   M switched buffers where each of the M switched buffers includes one input terminal and complementary high and low output terminals,
   a first unidirectional current device, and
   a second unidirectional current device;

(b) operatively connecting the high output terminals of each of the M switched buffers to the anode of the first unidirectional current device within the integrated circuit;

(c) operatively connecting the low output terminals of each of the M switched buffers to the cathode of the second unidirectional current device within the integrated circuit; and (d) operatively connecting the cathode of the first unidirectional current device to the anode of the second unidirectional current device within the integrated circuit to thereby provide an output terminal for the M×1 multiplexer.

* * * * *